(12) United States Patent
Ohno et al.

(10) Patent No.: US 11,798,983 B2
(45) Date of Patent: Oct. 24, 2023

(54) SEMICONDUCTOR DEVICE WITH DEEPLY DEPLETED CHANNEL AND MANUFACTURING METHOD THEREOF

(71) Applicant: United Semiconductor Japan Co., Ltd., Kuwana (JP)

(72) Inventors: Fumitaka Ohno, Kuwana (JP); Makoto Yasuda, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 0 days.

(21) Appl. No.: 17/379,962

(22) Filed: Jul. 19, 2021

(65) Prior Publication Data
US 2023/0012834 A1  Jan. 19, 2023

(51) Int. Cl.
*H01L 29/423* (2006.01)
*H01L 29/06* (2006.01)
(Continued)

(52) U.S. Cl.
CPC ...... *H01L 29/0638* (2013.01); *H01L 29/1033* (2013.01); *H01L 29/4236* (2013.01); *H01L 29/66621* (2013.01)

(58) Field of Classification Search
CPC ......... H01L 29/06; H01L 29/10; H01L 29/66; H01L 29/423; H01L 29/0638; H01L 29/1033; H01L 29/4236; H01L 29/66621; H01L 29/66643; H01L 29/66628; H01L 29/66613; H01L 29/66636; H01L 29/0843; H01L 29/0891; H01L 29/7813; H01L 29/7825; H01L 29/42352; H01L 29/42336; H01L 21/8234; H01L 21/8238; H01L 21/823412; H01L 21/823418; H01L 21/823425; H01L 21/823807; H01L 21/823814; H01L 21/8236; H01L 21/823487; H01L 21/823885; H01L 29/78;
(Continued)

(56) References Cited

U.S. PATENT DOCUMENTS 6,093,951 A * 7/2000 Burr ............... H01L 29/7834
257/E29.054
6,278,165 B1 8/2001 Oowaki
(Continued)

FOREIGN PATENT DOCUMENTS

JP 63-114174 5/1988
JP 63-114174 A 5/1988
(Continued)

*Primary Examiner* — Chuong A Luu
(74) *Attorney, Agent, or Firm* — Winston Hsu (57) ABSTRACT

A semiconductor device includes a substrate, a gate structure, a source region, a drain region, a doped region, and a channel region. The gate structure is disposed in the substrate, and the source region and drain regions being a first conductivity type respectively disposed at two sides of the gate structure. The doped region being a second conductivity type different from the first conductivity type is disposed below and separated from the gate structure, the source region, and drain region, the doped region. The channel region is disposed between the doped region and the gate structure and in contact with the doped region, and a dopant concentration of the channel region is less than a dopant concentration of the doped region.

11 Claims, 5 Drawing Sheets

(51) Int. Cl.
*H01L 29/10* (2006.01)
*H01L 29/66* (2006.01)

(58) Field of Classification Search
CPC ............. H01L 29/7827; H01L 29/7838; H01L 29/665; H01L 29/1083; H01L 29/1037; H01L 29/42376
USPC ........................................................ 257/288
See application file for complete search history.

(56) References Cited

U.S. PATENT DOCUMENTS

| | | | |
|---|---|---|---|
| 2001/0030350 A1 | 10/2001 | Oowaki | |
| 2002/0014633 A1 | 2/2002 | Ashley | |
| 2002/0117725 A1 | 8/2002 | Oowaki | |
| 2006/0157797 A1 | 7/2006 | Tateshita | |
| 2009/0261350 A1* | 10/2009 | Yamamoto | H01L 29/7397 257/77 |
| 2010/0127329 A1* | 5/2010 | Park | H01L 29/78621 257/351 |
| 2011/0180883 A1* | 7/2011 | Chen | H01L 29/66575 257/E21.409 |
| 2013/0126819 A1* | 5/2013 | Satoh | H01L 45/146 438/238 |
| 2013/0256791 A1 | 10/2013 | Iguchi | |
| 2016/0079417 A1 | 3/2016 | Iguchi | |
| 2016/0284696 A1 | 9/2016 | Ema | |
| 2020/0144055 A1 | 5/2020 | Yoshida | |
| 2021/0167191 A1* | 6/2021 | Gu | H01L 29/66666 |

FOREIGN PATENT DOCUMENTS

| | | |
|---|---|---|
| JP | 1-204472 | 8/1989 |
| JP | 1-204472 A | 8/1989 |
| JP | 2-112284 | 4/1990 |
| JP | 2-112284 A | 4/1990 |
| JP | 4-68540 | 3/1992 |
| JP | 4-68540 A | 3/1992 |
| JP | 2001-250950 | 9/2001 |
| JP | 2003-179223 | 6/2003 |
| JP | 2006-190821 | 7/2006 |
| JP | 2006-253706 | 9/2006 |
| JP | 2009-194392 | 8/2009 |
| JP | 2010-177318 | 8/2010 |
| JP | 2013-206945 | 10/2013 |
| JP | 2016-184655 | 10/2016 |
| JP | 2020-77712 | 5/2020 |
| WO | 9928975 | 6/1999 |

* cited by examiner

SEMICONDUCTOR DEVICE WITH DEEPLY DEPLETED CHANNEL AND MANUFACTURING METHOD THEREOF

BACKGROUND OF THE INVENTION

1. Field of the Invention

The present disclosure generally relates to a semiconductor device, and more particularly to a semiconductor device with a deeply depleted channel.

2. Description of the Prior Art

Generally, a semiconductor device with deeply depleted channel is a device manufactured on a bulk silicon substrate. In the operation of such device, a depleted region can be generated below the gate structure at a predefined distance, which exhibits the electrical characteristic similar to that exhibited by a buried oxide of the silicon-on-insulator (SOI) substrate. Since the bulk silicon substrate is less expensive than SOI substrate, the semiconductor device with deeply depleted channel is becoming more and more popular in certain applications, such as IoT device applications with necessary of low power consumption.

The semiconductor device with deeply depleted channel usually includes a planar gate structure and a highly doped region (also called screen region, SCR region). The SCR region is disposed under the planar gate structure at a predefined distance. However, there is often a current leakage generated between each source/drain region and the SCR region, which negatively affects the electrical performance of the semiconductor device.

SUMMARY OF THE INVENTION

In view of this, there is still a need to provide an improved semiconductor device with deeply depleted channel and a manufacturing method thereof.

According to some embodiments of the present disclosure, a semiconductor device is provided and includes a substrate, a gate structure, a source region, a drain region, a doped region, and a channel region. The gate structure is disposed in the substrate, and the source region and drain regions being a first conductivity type respectively disposed at two sides of the gate structure. The doped region being a second conductivity type different from the first conductivity type is disposed below and separated from the gate structure, the source region, and drain region. The channel region is disposed between the doped region and the gate structure and in contact with the doped region, and a dopant concentration of the channel region is less than a dopant concentration of the doped region.

According to some embodiments of the present disclosure, a method for manufacturing a semiconductor device is provided and includes the following. A substrate is provided and a doped region is formed on the substrate. Then, a channel layer is formed on the doped region, and a trench is formed in the channel layer. Subsequently, a gate structure is formed in the trench, where the gate is disposed above and separated from the doped region. A source region and a drain region are then formed at two sides of the gate structure, where the source region and the drain region are disposed above and separated from the doped region. A dopant concentration of the channel layer is less than a dopant concentration of the doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present technology is described with reference to the attached figures, wherein like reference numerals are used throughout the figures to designate similar or equivalent elements. The figures are not drawn to scale and they are provided merely to illustrate the instant technology. Several aspects of the technology are described below with reference to example applications for illustration. It should be understood that numerous specific details, relationships, and methods are set forth to provide a full understanding of the technology. One having ordinary skill in the relevant art, however, will readily recognize that the technology can be practiced without one or more of the specific details or with other methods. In other instances, well-known structures or operations are not shown in detail to avoid obscuring the technology. The present technology is not limited by the illustrated ordering of acts or events, as some acts may occur in different orders and/or concurrently with other acts or events. Furthermore, not all illustrated acts or events are required to implement a methodology in accordance with the present technology.

Figure 1:
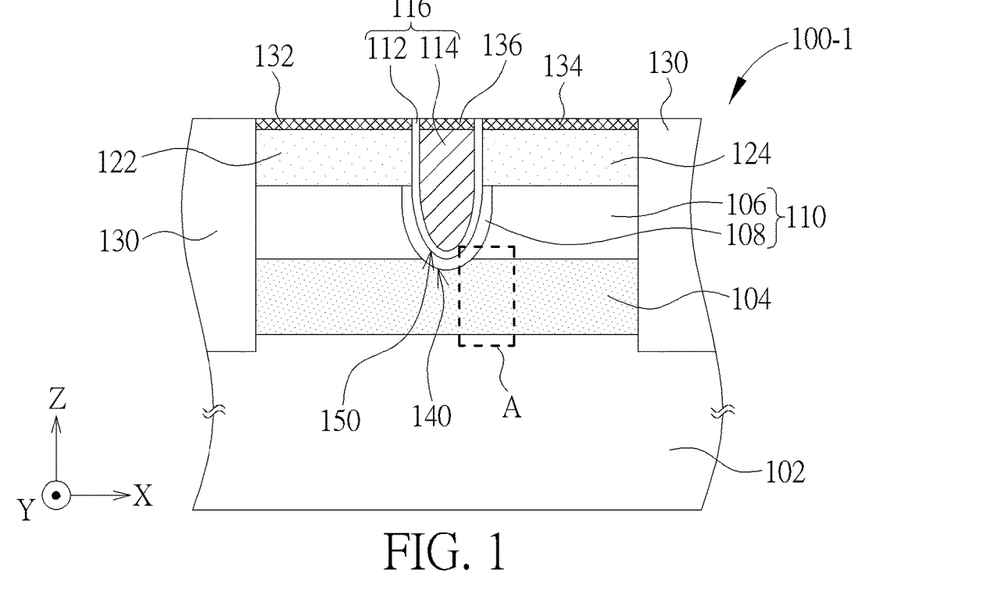
FIG. 1 is a schematic cross-sectional view illustrating a semiconductor device according to some embodiments of the present disclosure.

FIG. 1 is a schematic cross-sectional view illustrating a semiconductor device 100-1 according to some embodiments of the present disclosure. Referring to FIG. 1, a semiconductor device 100-1 may be a transistor with deeply depleted channel, and the semiconductor device 100-1 may include at least a substrate 102, a doped region 104, a channel region 110, a gate structure 116, a source region 122, and a drain region 124.

The substrate 102 may be a semiconductor substrate of a required conductivity type, such as n-type or p-type. In the present disclosure, the substrate 102 may also be any type of substrate used for forming semiconductor devices thereon, including single crystal substrates, semiconductor on insulator (SOI) substrates, and epitaxial film on semiconductor (EPI) substrates, to name a few. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

The doped region 104 may be disposed on the substrate 102, and the doped region 104 may be disposed below and separated from the gate structure 116. The doped region 104 may have a concentration profile in a way that its dopant concentration gradually increases from the bottom of the doped region 104 to a predetermined region adjacent to the top of the doped region 104, and then the dopant concentration gradually decreases from the predetermined region to the top of the doped region 104. For the doped region 104 having a concentration profile, the peak concentration of the concentration profile may be $5 \times 10^{18}$ to $1 \times 10^{20}$ atoms/cm$^3$, such as be equal to $5 \times 10^{18}$ atoms/cm$^3$, more than $5 \times 10^{18}$ atoms/cm$^3$ and less than $1 \times 10^{20}$ atoms/cm$^3$, or equal to $1 \times 10^{20}$ atoms/cm$^3$. The peak concentration of the doped region 104 may extend laterally in a horizontal region below the source region 122, the drain region 124, and the gate structure 116. For an n-type semiconductor device, such as silicon-based NMOS, the doped region 104 may include p-type dopants, such as boron (B) or indium (I). In contrast, for a p-type semiconductor device, such as silicon-based PMOS, the doped region 104 may include n-type dopants, such as arsenic (As), antimony (Sb) or phosphorous (P). It is noted that, for a case where the doped region 104 is formed by performing an implantation process on the substrate 102, the doped region 104 may be regarded a doped region disposed in an upper portion of the substrate 102. In contrast, for a case where the doped region 104 is formed by performing an epitaxial growth process on the substrate 102, the doped region 104 may be regarded a doped region disposed on a top surface of the substrate 102.

The channel region 110 is disposed on the doped region 104 in a way that the source and drain regions 122, 124 may be separated from the doped region 104 by the channel region 110. Besides, portions of the channel region 110 may be disposed between the doped region 104 and the gate structure 116. Therefore, the gate structure 116 is also separated from the doped region 104 by the channel region 110. The channel region 110 may be an undoped or slightly doped region, such as undoped or slightly doped silicon, so that an average dopant concentration of the channel region 110 is less than an average dopant concentration of the doped region 104.

According to some embodiments of the present disclosure, the channel region 110 may be a single-layered structure or a double-layered structure. For a double-layered channel region 110, the channel region 110 may include a first channel layer 106 and a second channel layer 108 in contact with the underlying doped region 104. The first channel layer 106 may be an undoped or slightly doped layer laterally extending on the doped region 104. A trench 140 may be formed in the first channel layer 106 and extend to an upper portion of the doped region. Besides, the second channel layer 108 may be an undoped or slightly doped layer which conforms to the surface of the trench 140. Since the second channel layer 108 is disposed in the trench 140, portions of the second channel layer 108 may be regarded as being embedded in or surrounded by the doped region 104. According to different requirements, the trench 140 may be designed to include a curved surface or to include a surface including a flat bottom and slanted sidewalls. In either case, the second channel layer 108 may conform to the surface of the trench 140. According to some embodiments of the present disclosure, the thickness of the first channel layer 106 may be greater than the thickness of the second channel layer 108. For example, the first channel layer 106 may be approximately 100-150 nm in thickness, and the second channel layer 108 may be approximately 10-40 nm in thickness.

It should be noted that, although FIG. 1 illustrates a curved interface between the first channel layer 106 and the second channel layer 108, the interface may be hard to be detected or observed when both the first channel layer 106 and the second channel layer 108 are made of the same material, such as undoped silicon.

The gate structure 116 may be a trench gate including a gate dielectric 112 and a gate electrode 114, and the gate structure 116 may be disposed in a gate trench 150 defined by an inner surface of the second channel layer 108. Because of the existence of the second channel layer 108, the gate structure 116 may be separated from the first channel layer 106 and the underlying doped region 104. According to different requirements, the gate electrode 116 may be a polysilicon gate or a metal gate, but not limited thereto.

The source region 122 and the drain region 124 may be disposed at two sides of the gate structure 116 respectively. Specifically, the conductivity type of each of the source region 122 and the drain region 124 is different from the conductivity type of the doped region 104. For example, when the source region 122 and the drain region 124 are n-type regions (or p-type regions), the doped region 104 is p-type region (or n-type region).

Besides, in order to further reduce the contact resistance, conductive regions made of silicide or other conductive material may be formed at or on the upper portions of the gate electrode 114, the source region 122, and the drain region 124, respectively. For example, silicide regions 132, 134 may be disposed on and electrically coupled to the source region 122 and the drain region 124, respectively. A silicide region 136 may be disposed on the gate structure 116, such as disposed on and electrically coupled to the gate electrode 114 of the gate structure 116. The silicide region 136 on the gate structure 116 may be laterally (i.e. along x-direction) separated from the silicide regions 132, 134 respective disposed on the source region 122 and the drain region 124. In this way, electric current would not be directly transmitted between two adjacent silicide regions, thereby prevents possible leakage current in the semiconductor device 100-1.

Furthermore, in order to prevent the current (such as leakage) from flowing between adjacent devices, an isolation structure 130, such as shallow trench isolation (STI), may be used to surround the active region of the semiconductor device 100-1.

During the operation of the semiconductor device 100-1, the gate electrode 114 may be positively or negatively biased so that the carrier (e.g. hole or electron) may be transmitted between the source region 122 and the drain region 124 along a bottom surface of the gate dielectric 112. A depleted region may be induced by the voltage bias from the gate electrode 114 and generated near the interface of the doped region 104 and the channel region 110. Besides, since both of the source region 122 and the drain region 124 are disposed above and separated from the doped region 104, the source region 122 and the drain region 124 are not in direct contact with the underlying doped region 104. Therefore, current leakage between the source/drain regions 122, 124 and the underlying doped region 104 could be reduced or avoided effectively. Besides, since the carrier transmitted under the gate structure 116 mainly flows in the second channel layer 108, the electrical performance of the semiconductor device 100-1 may be well-controlled by adjusting the thickness of the second channel layer 108 to a predetermined value.

Figure 2:
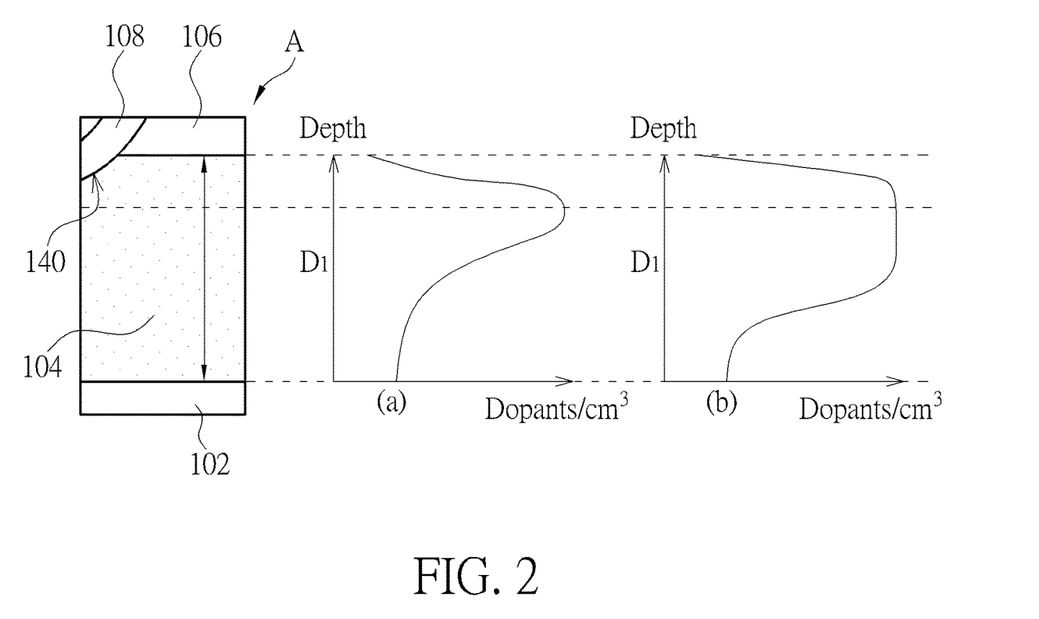
FIG. 2 is a schematic enlarged cross-sectional view illustrating a concentration profile in a region A of FIG. 1 according to some embodiments of the disclosure.

FIG. 2 is a schematic enlarged cross-sectional view illustrating a concentration profile in a region A of FIG. 1 according to some embodiments of the disclosure. Referring to FIG. 2, the doped region 104 may have gradually changed dopant concentration from the bottom of the doped region 104 to a predetermined depth of the doped region 104. Besides, the dopant concentration of the doped region 104 may be kept substantially the same along a lateral direction at every depth level. As illustrating in figure (a) and figure (b) on the right-hand side of FIG. 2, the concentration profile of the dopants in the doped region 104 may have at least one peak. The peak may have a maximum concentration at a predetermined depth (as illustrated in figure (a)) or have a maximum concentration distributed in a range along a depth direction (as illustrated in figure (b)). According to some embodiments of the present disclosure, in order to control the concentration profile of the dopants in the doped region 104, dopants may be implanted into the doped region 104 by performing one or more times of ion implantation processes with different implantation energy and doses. Preferably, the dopant concentration of the doped region 104 may substantially have a range as +/−30% of an average along the depth direction as a flat concentration profile, including the maximum concentration. More preferably, the dopant concentration of the doped region 104 may have a range as +/−20% of the average along the depth direction as the flat concentration profile, including the maximum concentration. Furthermore preferably, the dopant concentration of the doped region 104 may have a range as +/−10% of the average along the depth direction as the flat concentration profile, including the maximum concentration. Substantially, the flat concentration profile can be obtained with an appropriate condition of alternative performing ion implantations in several times according to selected accuracy of such range. It is noted that, the dopant concentration of the doped region 104 at a depth lower than the lowest point of the second channel layer 108 may have the maximum dopant concentration. In other words, the bottom surface of the second channel layer 108 under the gate structure 116 may be shallower than the depth of the maximum dopant concentration.

Figure 3:
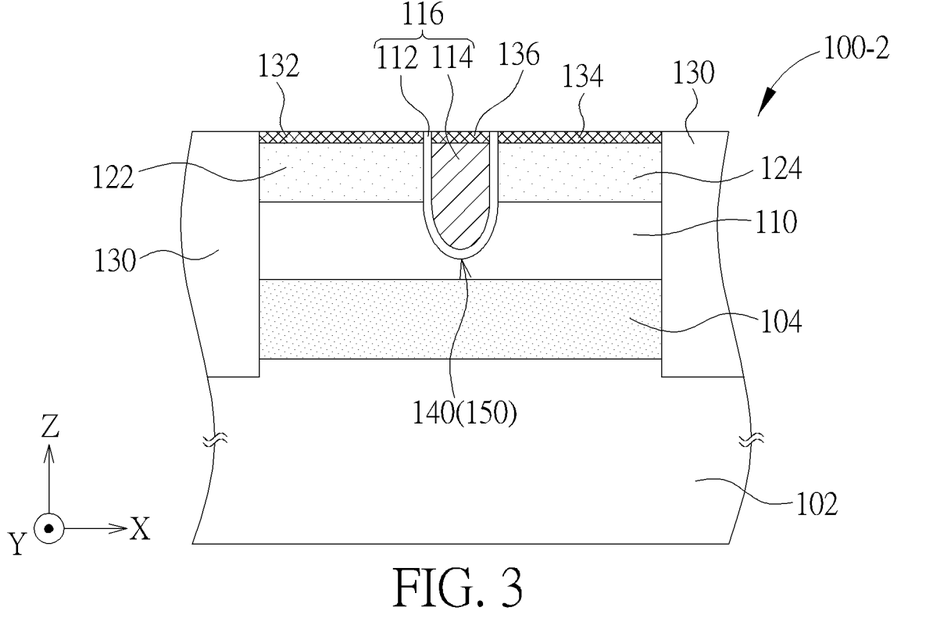
FIG. 3 is a schematic cross-sectional view illustrating a semiconductor device according to some alternative embodiments of the present disclosure.

FIG. 3 is a schematic cross-sectional view illustrating a semiconductor device according to some alternative embodiments of the present disclosure. Referring to FIG. 3, the semiconductor device 100-2 illustrated in FIG. 3 is similar to the semiconductor device 100-1 illustrated in FIG. 1, the main difference is that the channel region 110 is a single-layered structure rather than a double-layered structure. Thus, the trench 150 formed in the channel region 110 may not be covered with a thin layer of semiconductor, such as undoped silicon. Besides, the trench 150 may be regarded as the gate trench 150 used to accommodate the gate structure 116. According to the semiconductor device 100-2 illustrated in FIG. 3, the doped region 104 is also separated from the gate structure 116, the source region 122, and the drain region 124. Since both of the source region 122 and the drain region 124 are disposed above and separated from the doped region 104, the source region 122 and the drain region 124 are not indirect contact with the underlying doped region 104. Therefore, current leakage between the source/drain regions 122, 124 and the underlying doped region 104 could be reduced or avoided effectively.

Figure 4:
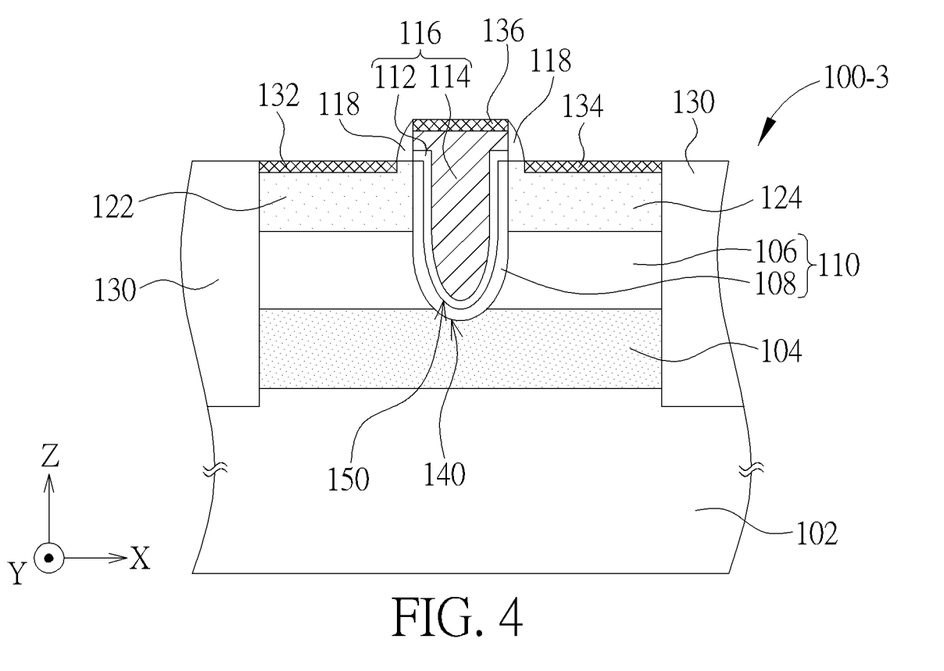
FIG. 4 is a schematic cross-sectional view illustrating a semiconductor device according to some alternative embodiments of the present disclosure.

FIG. 4 is a schematic cross-sectional view illustrating a semiconductor device according to some alternative embodiments of the present disclosure. Referring to FIG. 4, the semiconductor device 100-3 illustrated in FIG. 4 is similar to the semiconductor device 100-1 illustrated in FIG. 1, the main difference is that portions of the gate electrode 114 with a width such as 20-200 nm is protruded from the gate trench 150 so that the top surface of the gate electrode is higher than the top surfaces of the source region 122 and the drain region 134. Besides, spacers 118 with a width such as 10-50 nm may be disposed at two sides of the gate structure 116, respectively. Therefore, the gate structure 116 may be laterally separated from the source and drain regions 122, 124 by the spacers 118. The silicide region 136 disposed on the gate structure 116 may be laterally (i.e. along x-direction) and vertically (i.e. along z-direction) separated from the silicide regions 132, 134 respective disposed on the source region 122 and the drain region 124. In this way, electric current would not be directly transmitted between two adjacent silicide regions, thereby further preventing possible leakage current in the semiconductor device 100-3 rather than semiconductor device 100-1 illustrated in FIG. 1. Besides, because of the existence of the spacers 118 respectively disposed on two sidewalls of the gate electrode 114, the silicide regions 132, 134 may be disposed farther away from the sidewalls of the gate electrode 114 respectively as compared with the semiconductor device 100-1 illustrated in FIG. 1 that have no spacers.

Figure 5:
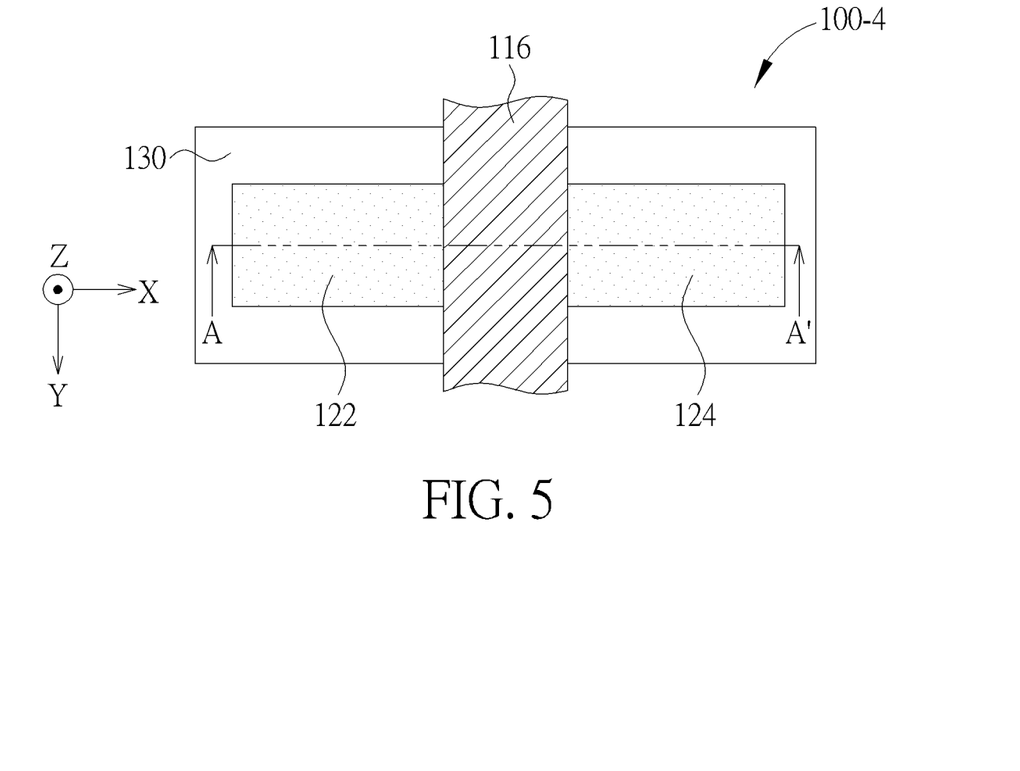
FIG. 5 is a schematic top view illustrating a semiconductor device according to some embodiments of the present disclosure.

FIG. 5 is a schematic top view illustrating a semiconductor device 100-4 according to some embodiments of the present disclosure. Referring to FIG. 5, cross-sectional views respectively illustrated in FIG. 1, FIG. 3, FIG. 4 may be regarded as being taken along a line A-A' of FIG. 5. The active region (not shown) including at least the source region 122 and the drain region 124 may be surrounded by the isolation structure 130. The source region 122 and the drain region 124 may extend along a first direction, such as x-direction, and the gate structure 116 may extend along a second direction, such as y-direction. It is noted that, the direction along which the source region 122 and the drain region 124 extend is not limited to be perpendicular to the direction along which the gate structure 116 extends.

In order to enable one of ordinary skill in the art to implement the present disclosure, a method of manufacturing a semiconductor device of the present disclosure is further described below.

Figure 6:
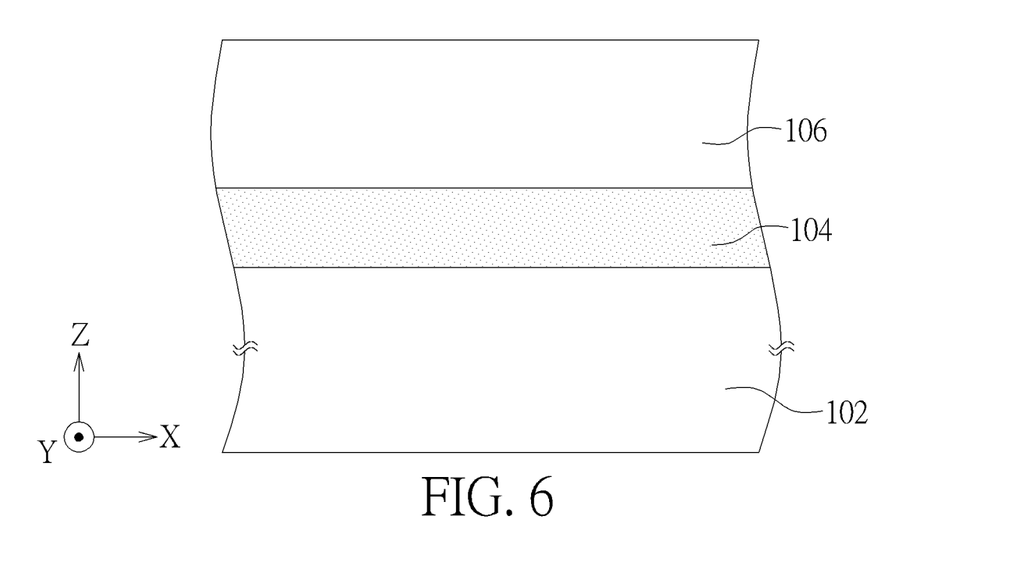
FIGS. 6-9 are schematic cross-sectional views illustrating processes of a method for manufacturing a semiconductor device according to some embodiments of the disclosure.

FIGS. 6-9 are schematic cross-sectional views illustrating processes of a method for manufacturing a semiconductor device according to some embodiments of the disclosure. Referring to FIG. 6, a substrate 102, such as semiconductor substrate, is provided. A doped well (not shown) of a certain conductivity type may be formed in the substrate 102. According to some embodiments of the present disclosure, the doped well may be formed by performing at least one ion implantation process. For example, for a p-type doped well, p-type dopant such as boron may be implanted into the substrate 102 with a dose of $1 \times 10^{12} \sim 1 \times 10^{14}$ $cm^{-2}$ at energy of 100~300 keV, but not limited thereto. Alternatively, for an n-type doped well, n-type dopant such as phosphorus may be implanted into the substrate 102 with a dose of $1\times10^{12}$~$1\times10^{14}$ cm$^{-2}$ at energy of 200~400 keV, but not limited thereto. A doped region 104 may be formed on the substrate 102 by an ion implantation process or by an epitaxial growth process. The conductivity type of the dopants in the doped region 104 is the same as the conductivity type of the dopants in the doped well. According to some embodiments of the present disclosure, the doped region 104 may be p-type region including p-type dopants, such as boron or indium. According to some alternative embodiments of the present disclosure, the doped region 104 may be n-type region including n-type dopants, such as arsenic (As), antimony (Sb) or phosphorous (P). In order to control the concentration profile of the dopants, various kinds of dopants may be implanted at different energy and dosage in one or more ion implantation processes. Besides, the doped region 104 may also include other dopants, such as carbon, germanium, or boron fluoride, which may be used to adjust the concentration profile of the p-type dopants or n-type dopants. According to some embodiments of the present disclosure, for a case where the doped region 104 is p-type, the p-type doped region 104 may be formed by performing several ion implantation processes in sequence, such as implanting germanium into the p-type doped well with a dose of $1\times10^{13}$~$1\times10^{15}$ cm$^{-2}$ at energy of 10~50 keV, implanting carbon into the p-type doped well with a dose of $1\times10^{13}$~$1\times10^{15}$ cm$^{-2}$ at energy of 2~10 keV, implanting boron into the p-type doped well with a dose of $1\times10^{12}$~$1\times10^{14}$ cm$^{-2}$ at energy of 10~30 keV, and implanting boron fluoride into the p-type doped well with a dose of $1\times10^{12}$~$1\times10^{14}$ cm$^{-2}$ at energy of 200~400 keV. According to some alternative embodiments of the present disclosure, for a case where the doped region 104 is n-type, the n-type doped region 104 may also be formed by performing several ion implantation processes in sequence, such as implanting antimony into the n-type doped well with a dose of $1\times10^{12}$~$1\times10^{14}$ cm$^{-2}$ at energy of 50~200 keV, and implanting antimony into the n-type doped well with a dose of $1\times10^{12}$~$1\times10^{14}$ cm$^{-2}$ at energy of 10~30 keV. After the processes for forming the doped region 104, the dopants in the doped region 104 may be activated by performing a heat treatment at a suitable temperature, such as in a range of 500~700° C.

According to some embodiments of the present disclosure, the conditions and/or times of the ion implantation for forming the doped region 104 may be adjusted so as to obtain the required concentration profile, such as the concentration profile shown in FIG. 2. In order to obtain the concentration profile shown in FIG. 2(b), dopants with certain conductivity may be implanted into the substrate 102 by performing several ion implantation processes rather than performing a single ion implantation process. For example, for the p-type doped region 104, p-type dopants such as boron fluoride (BF$_2$) may be implanted into the substrate 102 by performing four ion implantation processes in sequence, such as a first implantation process with a dose of $1\times10^{12}$~$1\times10^{14}$ cm$^{-2}$ at energy of 5~15 keV, a second implantation process with a dose of $1\times10^{12}$~$1\times10^{14}$ at energy of 7~17 keV, a third implantation process with a dose of $1\times10^{12}$~$1\times10^{14}$ cm$^{-2}$ at energy of 10~20 keV, and a fourth implantation process with a dose of $1\times10^{12}$~$1\times10^{14}$ cm$^{-2}$ at energy of 15~25 keV, but not limited thereto. Similarly, for the n-type doped region 104, n-type dopants such as antimony (Sb) may be implanted into the substrate 102 by performing four ion implantation processes in sequence, such as a first implantation process with a dose of $1\times10^{12}$~$1\times10^{14}$ cm$^{-2}$ at energy of 10~30 keV, a second implantation process with a dose of $1\times10^{12}$~$1\times10^{14}$ at energy of 15~35 keV, a third implantation process with a dose of $1\times10^{12}$~$1\times10^{14}$ cm$^{-2}$ at energy of 20~40 keV, and a fourth implantation process with a dose of $1\times10^{12}$~$1\times10^{14}$ cm$^{-2}$ at energy of 25~45 keV, but not limited thereto. In order to obtain an accurate range (i.e. smaller variation) of the dopant concentration along the depth direction as the flat concentration profile, alternative ion implantations may be performed several times for obtaining desired accurate concentration range, but not limited thereto. Also, if it is enough to obtain the accurate range of the dopant concentration along the depth direction as the flat concentration profile, fewer times of ion implantations can be adopted, but not limited thereto.

Still referring to FIG. 6, a first channel layer 106 with a thickness of 300-500 nm may be formed on the doped region 104 by an epitaxial growth process. The first channel layer 106 may be an undoped or slightly doped layer, and the dopant concentration of the first channel layer 106 is at least 10 to $10^3$ times less than the dopant concentration of the doped region 104.

Figure 7:
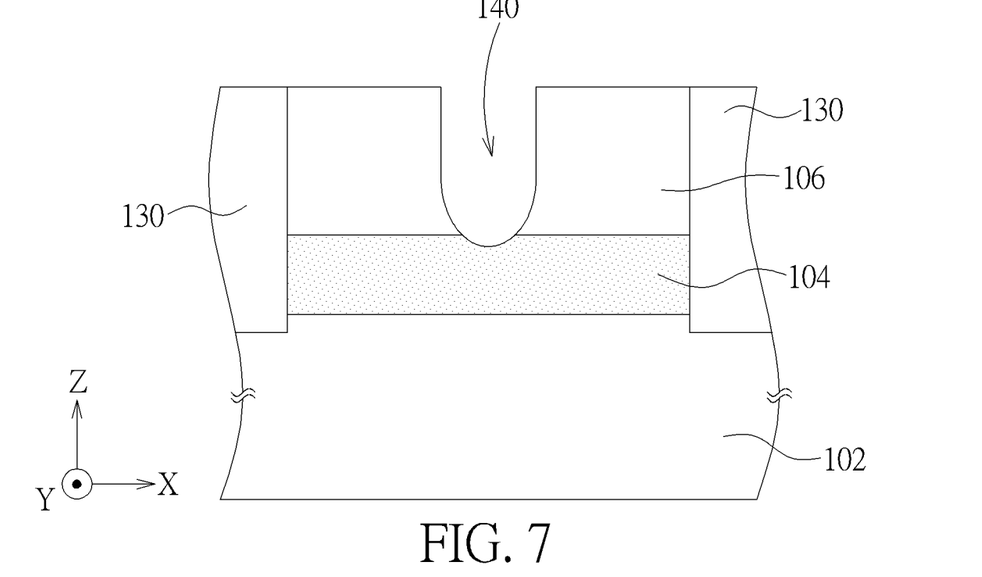

Referring to FIG. 7, an isolation structure 130 may be formed in a predetermined region, and then a trench 140 with a width (along x direction) of 50-150 nm and a depth of (along z direction) 250-550 nm may be formed in the first channel layer 106 and down to an upper portion of the doped region 104. Thus, a portion of the doped region 104 may be exposed from the bottom surface of the trench 140. It is noted that, according to some alternative embodiments of the present disclosure, the trench 140 may not reach the doped region 104 so that none of the doped region 104 may be exposed from the bottom surface of the trench 140. Moreover, even if none of the doped region 104 is exposed from the bottom surface of the trench 140 after the main process for forming the trench 140, additional post-treatment, such as a wet etching process, may be performed on the bottom surface of the trench 140 until the doped region 104 is exposed from the bottom surface of the trench 140. Besides, during the processes of forming the isolation structure 130 and the trench 140, the top surface of the first channel layer 106 may be covered with a thin protection layer, such as SiO$_2$, in order to protect the top surface of the first channel layer 106 from damages.

Figure 8:
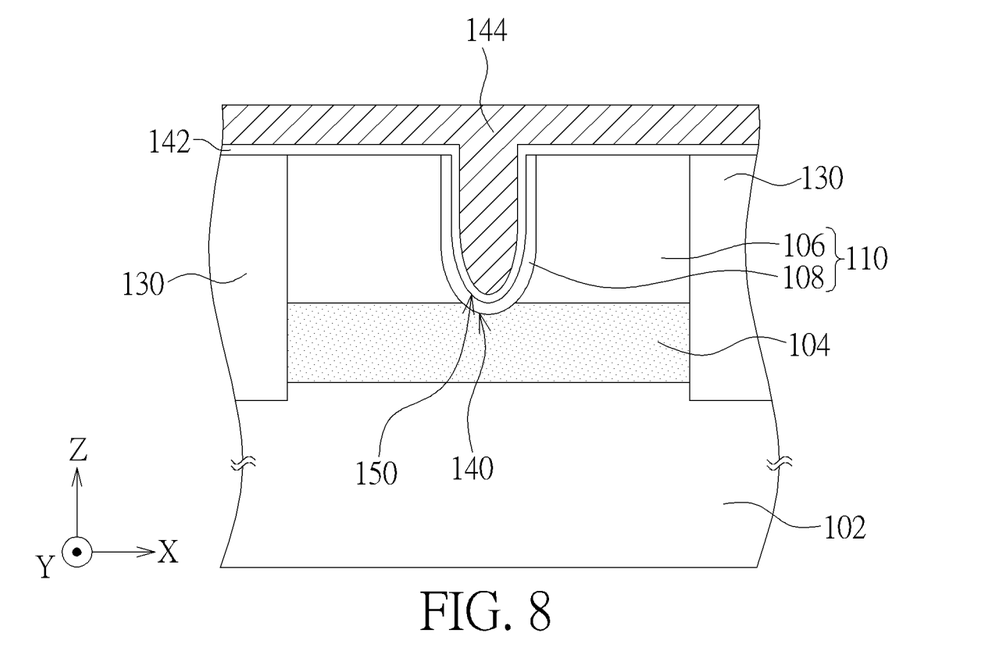

Referring to FIG. 8, a second channel layer 108 with a thickness of 10-40 nm may be formed on the surface of the trench 140 to define a gate trench 150. However, in a case where the first channel layer 106 is remained at the bottom surface of the trench 140, the second channel layer 108 may be omitted and thus not be formed in the trench 140 according to some alternative embodiments of the present disclosure, such as the structure illustrated FIG. 3. The lower portion of the second channel layer 108 may be in direct contact with the doped region 104. Besides, the second channel layer 108 may be an undoped or slightly doped layer, and the dopant concentration of the second channel layer 108 is at least 10 to $10^3$ times less than the dopant concentration of the doped region 104. Then, a gate dielectric layer 142 may be conformally formed on the exposed surface of the first channel layer 106 and the second channel layer 108. According to some embodiments of the present disclosure, the gate dielectric layer 142 with a thickness of 1-3 nm may be formed by thermal oxidation at a processing temperature of 800-1000° C. According to some alternative embodiments of the present disclosure, the gate dielectric layer 142 made of silicon oxynitride, hafnium oxide and the like may be formed by deposition process. Subsequently, a gate electrode layer 144, which can be polysilicon or metal, is formed on the gate dielectric layer 142 and fills up the gate trench 150. In order to fill the trench 150 completely, the thickness of the gate electrode layer 144 may be in a range of 500-700 nm.

Figure 9:
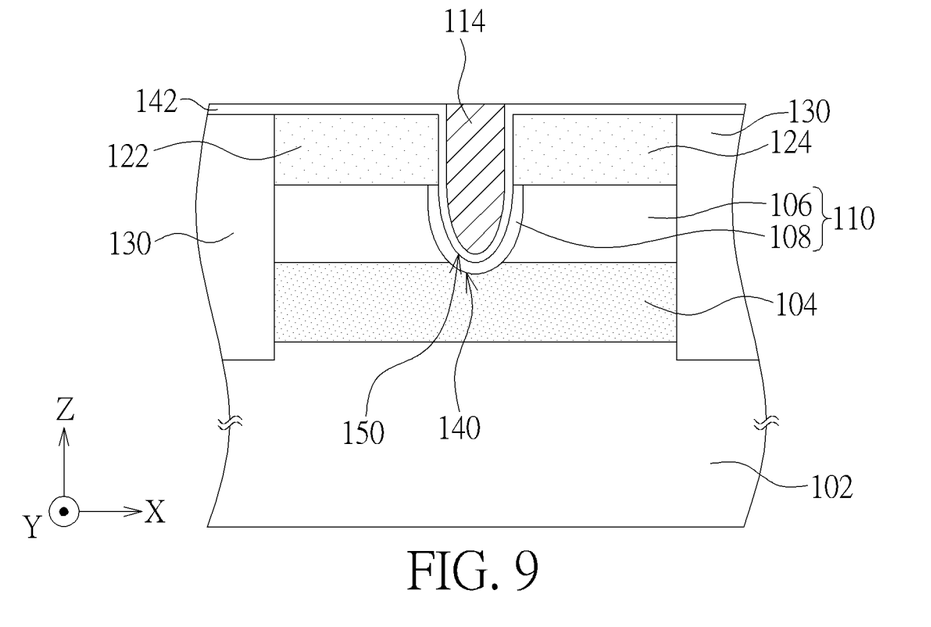

Referring to FIG. 9, the gate electrode layer 144 may be planarized to form a gate electrode 114 in the gate trench 150 with stopping on the gate dielectric layer 142. Afterwards, a source region 122 and a drain region 124 may be formed at sides of the gate electrode 114 by implanting dopants into the first channel layer 106 and the second channel layer 108. According to some embodiments of the present disclosure, for a case where the source region 122 and the drain region 124 are both n-type, the source region 122 and drain region 124 may also be formed by performing at least one ion implantation processes, such as implanting phosphorus with a dose of $1\times10^{15}$~$1\times10^{17}$ cm$^{-2}$ at energy of 5~15 keV. According to some alternative embodiments of the present disclosure, for a case where the source region 122 and the drain region 124 are both p-type, the source region 122 and drain region 124 may be formed by performing several ion implantation processes in sequence, such as implanting boron with a dose of $1\times10^{12}$~$1\times10^{14}$ cm$^{-2}$ at energy of 5~15 keV, implanting germanium with a dose of $1\times10^{14}$~$1\times10^{16}$ cm$^{-2}$ at energy of 10~30 keV, and implanting boron with a dose of $1\times10^{14}$~$1\times10^{16}$ cm$^{-2}$ at energy of 3~10 keV. After the processes for forming the source region 122 and the drain region 124, the dopants in the source region 122 and the drain region 124 may be activated by performing a heat treatment such as spike annealing at a suitable temperature, such as in a range of 1000~1100° C. Afterwards, silicidation processes may be carried out to form metal silicide respectively in the source region 122, the drain region 124, and the gate electrode 114. Other processes may be performed afterwards so as to obtain the structure as illustrated in FIG. 1.

Figure 10:
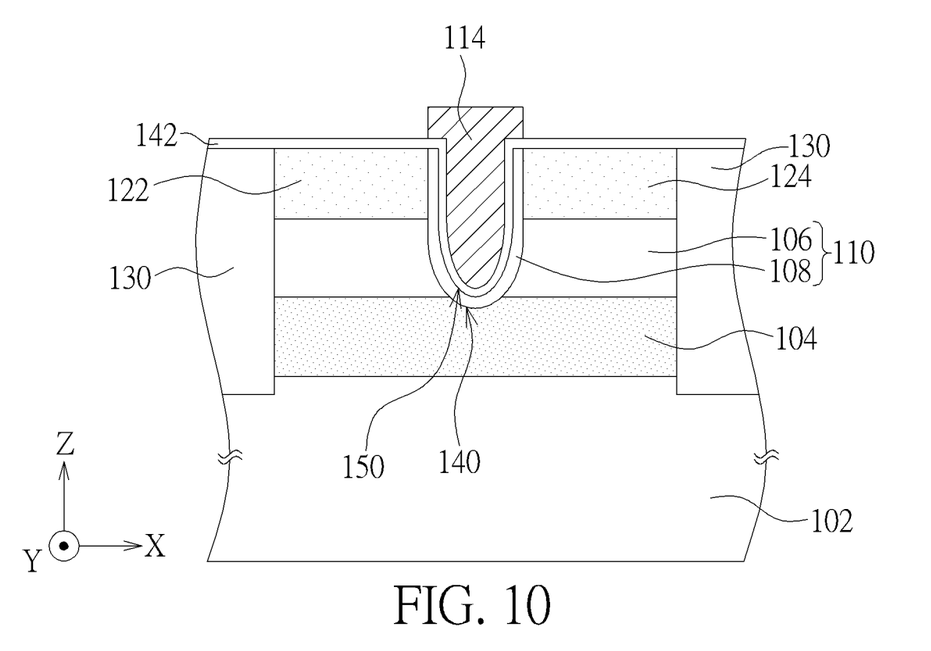
FIG. 10 is schematic cross-sectional view illustrating a process of a method for manufacturing a semiconductor device according to some alternative embodiments of the present disclosure.

FIG. 10 is schematic cross-sectional view illustrating a process of a method for manufacturing a semiconductor device according to some alternative embodiments of the present disclosure. Referring to FIG. 10, the process illustrated in FIG. 10 is an alternative process following FIG. 8. According to some alternative embodiments of present disclosure, following the step of FIG. 8, in order to manufacture the gate structure 116 as illustrated in FIG. 4, the gate electrode layer 144 may be patterned by photolithography process to form the gate electrode 114 illustrated in FIG. 10. The two opposite protruded sidewalls 118 of the gate electrode 114 (not illustrated) may be further formed with a width (along x-direction) of 50-150 nm as illustrated in FIG. 4 after forming the gate electrode 114, the source region 122 and the drain region 124 (not illustrated) may be further formed as illustrated in FIG. 4 after forming the two opposite protruded sidewalls 118, and the silicide regions 132, 134, 136 (not illustrated) may be further formed as illustrated in FIG. 4 after forming the source region 122 and the drain region 124. Thus, both the patterned gate electrode 114 and two opposite sidewalls 118 may laterally (i.e. along x-direction) and vertically (i.e. along z-direction) can separate between the silicide region 136 disposed on the gate structure 116 and the silicide regions 132, 134 respective disposed on the source region 122 and the drain region 124 to further prevent possible leakage current in the semiconductor device 100-3 (not illustrated in FIG. 10) as illustrated in FIG. 4 rather than semiconductor device 100-1 as illustrated in FIG. 1, because of separating more with spacers 118. Besides, it should be noted that the thickness and width of the gate electrode 114 may be adjusted according to different requirement and should not be interpreted in a limited sense.

Afterwards, the source region 122 and the drain region 124 may be formed at sides of the gate electrode 114 by implanting dopants into the first channel layer 106 and the second channel layer 108. Thus, the top surface of the gate electrode 114 may be higher than the top surfaces of the source region 122 and the drain region 124. Afterwards, silicidation processes may be carried out to form metal silicide respectively in the source region 122, the drain region 124, and the gate electrode 114. Other processes may be performed afterwards so as to obtain the structure as illustrated in FIG. 4. It should be noted that, referring to FIG. 10, although each sidewall of the protruded portion of the gate electrode 114 are substantially aligned with the outer edge of the second channel layer 108, the sidewalls of the protruded portion of the gate electrode 114 may be laterally misaligned with the outer edge of the second channel layer 108. According to some embodiments of the present disclosure, the sidewall of the protruded portion of the gate electrode 114 may extend outwardly beyond the outer edge of the second channel layer 108 so that the gate electrode 114 may cover portions of the first channel layer 106, which prevent the doped region (i.e. S/D regions) from being formed in the portions of the first channel layer 106 that are covered by the gate electrode 114. According to some alternative embodiments of the present disclosure, the sidewall of the protruded portion of the gate electrode 114 may be trimmed inwardly relative to the outer edge of the second channel layer 108 so that portions of the doped region (i.e. S/D regions) may be formed in the portions of the second channel layer 108 that are not covered by the gate electrode 114.

While various embodiments of the present technology have been described above, it should be understood that they have been presented by way of example only, and not limitation. Numerous changes to the disclosed embodiments can be made in accordance with the disclosure herein without departing from the spirit or scope of the technology. Thus, the breadth and scope of the present technology should not be limited by any of the above described embodiments. Rather, the scope of the technology should be defined in accordance with the following claims and their equivalents.

Although the technology has been illustrated and described with respect to one or more implementations, equivalent alterations and modifications will occur to others skilled in the art upon the reading and understanding of this specification and the annexed drawings. In addition, while a particular feature of the technology may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the technology. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this technology belongs. Also, the terms "about", "substantially", and "approximately", as used herein with respect to a stated value or a property, are intended to indicate being within 20% of the stated value or property, unless otherwise specified above. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure disposed on the substrate;
   a source region and a drain region respectively disposed at two sides of the gate structure, the source region and the drain region being a first conductivity type;
   a doped region entirely disposed below the gate structure, the source region, and the drain region, the doped region being separated from the gate structure, the source region, and the drain region, the doped region being a second conductivity type different from the first conductivity type;
   a channel region disposed between the doped region and the gate structure, and the channel region being in contact with the doped region, and a dopant concentration of the channel region is less than a dopant concentration of the doped region; and
   a trench surrounded by the channel region, wherein the gate structure is disposed in the trench, and a bottom surface of the trench is lower than bottom surfaces of the source region and the drain region.

2. The semiconductor device of claim 1, wherein a portion of the channel region conforms to a surface of the trench.

3. The semiconductor device of claim 1, wherein a top surface of the gate structure is higher than top surfaces of the source region and the drain region.

4. The semiconductor device of claim 1, wherein the source region and the drain region are separated from the gate structure.

5. The semiconductor device of claim 1, further comprising:
   first silicide regions disposed on the source region and the drain region; and
   a second silicide region disposed on the gate structure, wherein each of the first silicide regions is laterally separated from the second silicide region.

6. The semiconductor device of claim 1, wherein a portion of the channel region is embedded in the doped region.

7. The semiconductor device of claim 1, wherein the channel region is further disposed between the doped region and the source/drain regions.

8. The semiconductor device of claim 1, wherein the doped region includes the dopant concentration to be equal to $5 \times 10^{18}$ atoms/cm$^3$, more than $5 \times 10^{18}$ atoms/cm$^3$ and less than $1 \times 10^{20}$ atoms/cm$^3$, or equal to $1 \times 10^{20}$ atoms/cm$^3$ at the first depth.

9. The semiconductor device of claim 1, wherein the doped region includes a maximum of the dopant concentration at a first depth along a depth direction, and a bottom surface of the channel region under the gate structure is shallower than the first depth.

10. The semiconductor device of claim 1, wherein the doped region including a dopant concentration to be equal to $5 \times 10^{18}$ atoms/cm$^3$, more than $5 \times 10^{18}$ atoms/cm$^3$ and less than $1 \times 10^{20}$ atoms/cm$^3$, or equal to $1 \times 10^{20}$ atoms/cm$^3$ is disposed under the source region and the drain region.

11. The semiconductor device of claim 1, further comprising:
    an isolation structure disposed in the substrate,
    wherein the doped region is reached to the isolation structure.

* * * * *